US006744177B2

United States Patent
Riedel et al.

(10) Patent No.: US 6,744,177 B2
(45) Date of Patent: Jun. 1, 2004

(54) PIEZOELECTRIC BENDING TRANSDUCER AND USE THEREOF

(75) Inventors: Michael Riedel, Rödental (DE); Karl Lubitz, Ottobrunn (DE); Andreas Schmid, Michelau (DE); Martin Maichl, Salach (DE); Markus Hoffmann, Wolfschlugen (DE); Michael Weinmann, Plüderhausen (DE)

(73) Assignees: Festo AG & Co., Esslingen (DE); Siemens AG, Munich (DE)

( * ) Notice: Subject to any disclaimer, the term of this patent is extended or adjusted under 35 U.S.C. 154(b) by 0 days.

(21) Appl. No.: 10/258,501

(22) PCT Filed: May 11, 2001

(86) PCT No.: PCT/EP01/05395

§ 371 (c)(1),
(2), (4) Date: Apr. 29, 2003

(87) PCT Pub. No.: WO01/89004

PCT Pub. Date: Nov. 22, 2001

(65) Prior Publication Data

US 2003/0160544 A1 Aug. 28, 2003

(30) Foreign Application Priority Data

May 15, 2000 (DE) .......................... 100 23 556

(51) Int. Cl.$^7$ .............................................. H01L 41/08
(52) U.S. Cl. .................. 310/332; 310/366; 310/332; 310/359
(58) Field of Search ................................ 310/326–328, 310/330–332, 334, 355, 359, 366

(56) References Cited

U.S. PATENT DOCUMENTS

| | | | | |
|---|---|---|---|---|
| 4,349,762 A | * | 9/1982 | Kitamura et al. | 310/332 |
| 4,363,993 A | * | 12/1982 | Nishigaki et al. | 310/332 |
| 4,610,426 A | * | 9/1986 | Brandner | 251/129.06 |
| 4,649,313 A | * | 3/1987 | Ogawa et al. | 310/358 |
| 4,678,957 A | | 7/1987 | Harnden, Jr. et al. | |
| 5,038,069 A | * | 8/1991 | Lukasiewicz et al. | 310/338 |
| 5,233,256 A | * | 8/1993 | Hayashi et al. | 310/317 |
| 5,376,860 A | * | 12/1994 | Sato | 310/346 |
| 5,404,067 A | * | 4/1995 | Stein et al. | 310/330 |
| 5,473,214 A | * | 12/1995 | Hildebrand | 310/321 |
| 5,912,679 A | * | 6/1999 | Takayama et al. | 347/10 |
| 6,316,865 B1 | * | 11/2001 | Riedel | 310/332 |
| 6,318,342 B1 | | 11/2001 | Simon et al. | |
| 6,429,574 B1 | * | 8/2002 | Mohr et al. | 310/334 |

FOREIGN PATENT DOCUMENTS

| | | |
|---|---|---|
| EP | 0309147 A2 | 3/1989 |
| GB | 2011734 A | 7/1979 |
| JP | 0218378 | 7/1990 |
| WO | WO89/07345 | 8/1989 |
| WO | WO95/20827 | 8/1995 |
| WO | WO95/25920 | 9/1995 |
| WO | WO99/13681 | 3/1999 |

* cited by examiner

Primary Examiner—Thomas M. Dougherty
Assistant Examiner—Karen Beth Addison
(74) Attorney, Agent, or Firm—Hoffmann & Baron, LLP

(57) ABSTRACT

A piezoelectric flexural transducer having an elongated support body (2), that on at least one longitudinal side is provided with a piezoelectric multi-layer body (6). In the interior of the support body (2) and/or between the support body (2) and the piezoelectric multi-layer body (6) and/or between neighboring piezoelectric material layers of the piezoelectric multi-layer body (6) at least one component (24 and 32) of an electronic (23) and/or sensor (33) system is accommodated employed for the operation of the piezoelectric flexural transducer.

18 Claims, 4 Drawing Sheets

PIEZOELECTRIC BENDING TRANSDUCER AND USE THEREOF

This applications claims priority from German Application No. 100 23 556.5 filed on May 15, 2000.

FIELD OF THE INVENTION

The invention relates to a piezoelectric flexural transducer possessing an elongated support body, which on at least one longitudinal side is provided with a piezoelectric multi-layer body having a plurality of layers of piezoelectric material and intermediately placed electrodes. The invention furthermore relates to the use of such a piezoelectric flexural transducer.

BACKGROUND OF THE INVENTION

Such a piezoelectric flexural transducer, which may also be described as a multi-layer flexural actuator, is disclosed for example in the patent publication WO 99/17383. This piezoelectric flexural transducer comprises an elongated, plate-like or, respectively, bar-like support body, which on its two oppositely placed longitudinal sides with a large area is provided respectively with a piezoelectric multi-layer body. Each piezoelectric multi-layer body is composed of a plurality of superposed piezoelectric material layers and furthermore sheet-like electrodes arranged between the piezoelectric material layers. An electrical conductor, which extends over the body, can be utilized to apply a control voltage causing a contraction in length of a piezoelectric multi-layer body, this resulting in a deflection of the piezoelectric flexural transducer perpendicularly to the longitudinal direction thereof.

For the operation of the piezoelectric flexural transducer recourse is as a rule had to a suitable electronic system, whose components ensure, for example, the conversion of an available low voltage current into the sufficiently high control voltage. In this respect multi-layer technology offers the advantage that the electrical energy necessary for the operation of the piezoelectric flexural transducer is available even at a substantially lower control voltage than in the case of a comparably dimensioned monolithic piezoelectric body. However, the electronic components do have a substantial requirement as regards necessary space and this hinders the miniaturization of devices, as for example valves, having the piezoelectric flexural transducer.

A further problematical issue with the known piezoelectric flexural transducers is the monitoring and/or feedback supply as regards the operational behavior. The provision of sensor technology suitable for this purpose is again something which is unfavorable as regards the overall size of the device fitted with the piezoelectric flexural transducer.

SUMMARY OF THE INVENTION

Accordingly one object of the present invention is to indicate measures, which render possible more compact dimensions of devices having a piezoelectric flexural transducer of the type initially mentioned. A further aim of the invention is as regards a suitable application of such a piezoelectric flexural transducer.

The first mentioned aim in connection with a piezoelectric flexural transducer of the type initially mentioned is attained since in the interior of the support body and/or between the support body and the piezoelectric multi-layer body and/or between adjacent piezoelectric material layers of the piezoelectric multi-layer body at least one component of an electronic and/or sensor system, which is utilized for the operation of the piezoelectric flexural transducer, is accommodated.

The invention is based on the recognition that the components, to be employed in conjunction with a multi-layer flexural transducer, of the electronic and/or sensor system necessary for operation may be so designed as regards their dimensions and their geometry, that an integration in the piezoelectric flexural transducer is possible and it is accordingly possible to dispense with electronic and/or sensor components, which would necessitate a larger amount of space for their installation. Thus the electronic and/or sensor components may for example be accommodated in the interior of the support body, although they can be also placed between the piezoelectric material layers of the piezoelectric multi-layer body or between the support body and the piezoelectric multi-layer body mounted on same. In connection with the sensor components this then opens up the possibility of placing same practically at that position, where an operation-relevant parameter is to be detected.

Thus for example in the case of safety-relevant valve applications reliable and exact feedback information on the actuator setting may be ensured.

It has been found to be particularly advantageous to provide the piezoelectric flexural transducer with a piezoelectric multi-layer body, in the case of which the layer thickness of the individual piezoelectric material layers is 25 $\mu$m at the most, a thickness range between 14 $\mu$m and 20 $\mu$m being recommended, the most preferred layer thickness being 17 $\mu$m. This results a low voltage multi-layer structure having extremely thin layers and accordingly a much reduced component drive voltage, which is substantially less than the state of the art component voltages in the range above 60 volts. Accordingly the structural complexity of the circuits necessary for voltage conversion is also reduced, this simplifying the integration in the piezoelectric flexural transducer in accordance with the invention even more. Moreover, there is the advantage that design standards applying for the high voltage range are no longer relevant and accordingly a greater variety of design possibilities is opened up for the placement of wiring and the design of the housing in the piezoelectric flexural transducer or, respectively, equipment fitted with it. Nevertheless sufficient electrical field strength is achieved in the piezoelectric material and, as having regard to the overall size, larger setting forces and larger displacements are possible.

Further advantageous developments of the invention are defined in the dependent claims.

At least one of the integrated electronic components may form part of a voltage converter circuit, a current limiting circuit or a charging and discharging circuit or directly itself constitute one such circuit.

At least one such sensor component may be constituted by a displacement sensor responsive to deflection or displacement of the flexural transducer, for example in the form of a strain gage strip (DMS), by one or more piezoelectric material layers or by inductive pickups and coils. A substantial advantage of a displacement sensor integrated in the support material or in the piezoelectric material lies in the possibility of use in the case of systematic follow-up of the actuator's displacement for the compensation of the piezoelectric relaxation and drift effects. This renders possible control applications with long term stability. A further possibility of use is functional monitoring of the setting element.

Furthermore additional sensors of an desired type and structure may be integrated in the system, for example force, acceleration or temperature sensors.

The integration of one or more electronic and/or sensor components in the support body may be performed particularly simply, if the support body is designed in the form of a multi-layer body having at least two superposed support body layers, the layer planes of the support body being preferably parallel to those of the piezoelectric material layer and the respective components being able to be placed betwixt two respective neighboring layers of the support body.

In order to be able to provide the electrical conductors required for the control of the piezoelectric multi-layer body and furthermore for the operation of any sensor systems present with an optimum distribution on the support body, the electrical conductors present are preferably arranged in different component carrying planes of the support body, the mutual connection being produced by means of one or more metal lined holes or metal filled holes, so-called vias, which extend athwart the fitting planes. In the case of a support body produced using multi-layer body technology electrical conductors may be provided both between neighboring layers of the support body and also on the outer face of the outer support body layers, electrical conductors, which are located on either side of a support body layer, being able to be contacted by means of metal lined holes or metal filled holes, which merely extend through the respective support body layer.

This structure is more especially advantageous when the piezoelectric flexural transducer possesses a so-called trimorphous form, the support body being fitted with two piezoelectric bodies, which are set on two mutually remote longitudinal sides of the support body. In this case the two piezoelectric bodies are preferably designed in the form of piezoelectric multi-layer bodies of the above mentioned type in order to render possible a forced displacement of the piezoelectric flexural transducer in two mutually opposite directions on the basis of the above mentioned advantages. The design may be such that the trimorphous flexural transducer has a middle layer in the form of a fiber composite—in conjunction with flexible printed wiring layers as a contact means with the active piezoelectric material layers, with the sensor system and/or with the electrical circuitry. With a suitable selection of materials having suitable coefficients of thermal expansion a systematic reduction of thermal drift is obtainable. One example for this is the systematic incorporation of copper layers in the overall structure of the actuator. In addition the reduction in thermal drift the copper layers may also be utilized to set the specific mechanical properties such as displacement and setting force and furthermore for contacting the active piezoelectric material layers, the integrated sensors and/or the electronic circuitry.

Instead of a second active piezoelectric body it is furthermore an advantage to provide an adaptive body, made of a material having-essentially the same coefficient of thermal expansion as the piezoelectric multi-layer body. This adaptive body does not contribute to producing displacement forces, that is to say it is therefore a passive element, although it is responsible for ensuring that, in comparison with a piezoelectric flexural transducer also having a piezoelectric body on one side thereof—a so-called unimorphous type—it is possible have a symmetrical design at relatively low cost so that inherent thermal flexure can be reduced or completely excluded. Moreover, it is possible for the adaptive material itself to be a sensor or to be integrated in a sensor. The sensor may also be integrated in the adaptive part.

The initially mentioned second object of the invention intended for achieving certain tasks, is made possible by having the piezoelectric flexural transducer in the form of a setting member of a valve, more particularly in the pneumatics sector for the control of air flows.

In the following the invention will be described with reference to the accompanying drawings.

DETAILED DESCRIPTION OF THE PREFERRED EMBODIMENTS

The flexural transducer 1 represented in FIGS. 1 through 5 comprises an elongated, plate- or bar-like support body 2, which has a certain degree of rigidity, although it is flexible and preferably comprises a fiber composite material or a multi-layer plastic, more especially polyamide.

Figure 5:
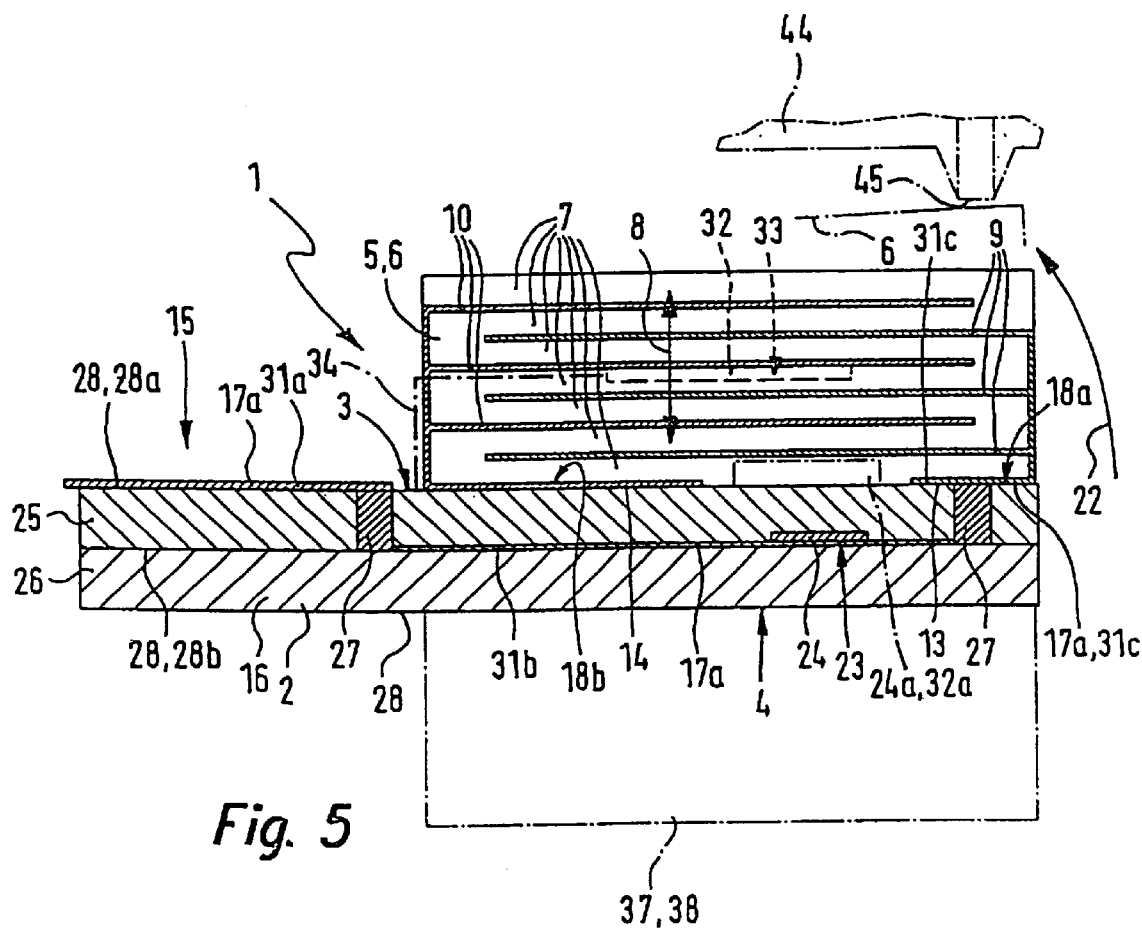
FIG. 5 shows the piezoelectric flexural transducer of FIGS. 1 through 4 in a cross section on the section line V—V of FIGS. 1 and 2, an advantageous application in conjunction with a control valve as employed in the pneumatic sector being indicated.

The large outer faces facing away from one another and located on the opposite longitudinal sides, of the support body 2 constitute a first support face 3, which in the example faces upward and furthermore a second support face 4 facing downward. On the first support face 3 a first piezoelectric body 5 is arranged which is produced using multi-layer body technology so that it is a question of a piezoelectric multi-layer body 6. As shown in FIG. 5 it comprises a plurality of even or flat piezoelectric material layers 7 which are stacked on each other with mutually parallel layer planes aligned perpendicularly to the support face 3 in a direction 8 of stacking indicated by a double arrow 8. As a piezoelectric material any suitable piezoelectric material may be employed, preferably a piezoelectric ceramic.

The planes of the piezoelectric material layers 7 extend in parallelism to the plane of extent of the support body 2.

Between respectively adjacent piezoelectric material layers 7 there extends a thin electrode 9 and 10 with a sheet-like form, preferably in the form of a metalized silver/palladium layer.

Here alternating first (9) and second (10) electrodes are provided alternating in the stacking direction so that each piezoelectric material layer 7—in the working embodiment with the exception of the lowermost and uppermost piezoelectric material layers 7—on opposite sides is flanked by a first and a second electrode 9 and 10. In this case both the first electrodes 9 and also the second electrodes 10 are connected with each other electrically and electrically connected with a first and, respectively, second contact making face 13 and 14, which is provided on the bottom side of the bottom piezoelectric material layer 7 directly adjoining the support body 2.

The top piezoelectric material layer 7 may, as illustrated, be an inactive covering layer but it would readily be possible to provide an electrode as well on its top side in order to use the layer actively.

The conductive layers extending on the outer faces of the piezoelectric multi-layer body 6, which serve for contacting the electrodes 9 and 10, are sealed off with a potting composition, not illustrated in detail.

The piezoelectric multi-layer body 6 only occupies a part of the overall length of the first support face 3. Accordingly the support body 2 has a connection section 16 extending past the piezoelectric multi-layer body 6 on a connection side 15 of the piezoelectric multi-layer flexural transducer 1. Electrical connections as needed from the operation of the piezoelectric flexural transducer 1 are made by way of connection section 16 and the connection section may also be utilized for clamping or holding-the piezoelectric flexural transducer.

For driving the piezoelectric multi-layer body 6 the support body 2 is for example provided with printed wiring, metalized layers and/or conductive plastic layers constituting first and second electrical conductors 17a and 17b. Same extend from the free end of the connection section 16 as far as the support body covered by the piezoelectric multi-layer body 6, where they take the form of first and second electrical connecting faces 18a and 18b, which are electrically in contact with the first and second contact making faces 13 and 14 of the piezoelectric multi-layer body 6.

Accordingly by way of the first and second electrical conductors 17a and 17b the piezoelectric multi-layer body 6 may have a drive voltage applied to it, which in a known manner causes a change in length of the piezoelectric material layers 7, this causing curving and a deflection or displacement of the piezoelectric flexural, transducer 1 clamped at the connection section 16, (perpendicularly to the length of the flexural transducer as indicated by the arrow 22) of the front end portion (which is not held) of the piezoelectric flexural transducer 1.

Although the connection section 16 may with advantage be employed for holding the piezoelectric flexural transducer 1, it is however also possible to provide the holding effect in the region, which adjoins the connection section 16, of the piezoelectric multi-layer body 6.

For reducing the drive voltage the piezoelectric material layers are extremely thin. The thickness of the layers is in the working example 17 μm, the overall thickness range to be recommended lying between 14 μm and 29 μm and preferably does exceed 25 μm. Owing to the possibility, due to this, of operation using low voltages with drive voltages of 60 volts at the most and preferably decidedly less than this for the maximum value, certain rules applying for high voltage applications are not valid here and there are more flexible possibilities as regards an optimum arrangement of the electrical conductors.

The design of the piezoelectric multi-layer body 6 in the form of a low voltage multi-layer body having thin layers with resulting low drive voltage leads to the further advantage that the electronic circuitry employed for the operation of the piezoelectric flexural transducer 1 may have a structure which as compared with conventional designs is substantially simpler, more compact and more economic.

The small overall size of the electronic circuitry 23 is taken advantage of in the case of piezoelectric flexural transducer 1 in order to integrate at least one electronic component 24 and preferably all electronic components or, respectively, the entire electronic drive circuitry in the piezoelectric flexural transducer 1. In the working embodiment illustrated in FIGS. 1 through 5 the electronic component 24 is well protected in the interior of the support body 2 which here is designed in the form of a multi-layer body and possesses two support body layers, placed flatwise against each other, between which the at least one electronic component 24 is placed. In the case of a support body 2 comprising more than two support body layers it would be likewise possible for the further layer transitions to be employed for the accommodation of one or more electronic components.

In order to contact the accordingly integrated electronic components 24 in the desired fashion suitably placed metal lined holes or metal filled holes 27, so-called vias, are provided in the support body 2. Having such metal lined holes or metal filled holes 27 means that different component carrying planes 28 with their own electrical conductors may be provided and the corresponding electrical conductors may be in electrical contact with each other. The number of the metal lined holes or metal filled holes 27 may in this case in principle be varied at will and will be dependent on the desired circuit layout.

In the working embodiment illustrated in FIGS. 1 through 5 the second electrical conductor 17b runs on the first support face 3, which in this case, as regards the electrical conductors, represents a first component carrying plane 28a. The second electrical conductor 17b here completely runs in the first component carrying plane 28a.

The first electrical conductor 17a on the other hand is divided up into several conductor sections, which extend in the various component carrying planes and are linked by means of metal lined holes or metal filled holes 27 together. Thus a first conductor section 31a in the connection section 16 extends on the first support face 3 and in the first component carrying plane 28a defined by it. Even before reaching the piezoelectric multi-layer body 6 a metal lined hole 27 is provided extending through only the first support body layer 25 having the first support face 3, same being constituted by the transition between the two support body layers 25 and 26. Here there is an adjoining second conductor section 31b of the first electrical conductor 17a, which extends in the interior of the support body 2 underneath the piezoelectric multi-layer body 6 and in so doing goes past the second electrical connection face 18b underneath same. At the level of the first electrical connection face 18a the second conductor section 31b is in electrical contact with a further metal lined hole 27, which again extends through the first, support body layer 25 and is connected with the third conductor section 31c defining the first electrical connection face 18a, such section 31c being located again in the first component carrying plane 28a.

The at least one electronic component 24 is placed in the second component carrying plane 28b and connected electrically with the conductor section 31b extending therein in the desired manner.

In the case of the twin layer support body 2 illustrated in working example metal lined holes or metal filled holes could also be provided, which would extend through both support body layers 25 and 26. There is also the possibility of providing mutually separate metal lined holes or metal filled holes in all support body layers in order to electrically link electrical conductors and/or electronic components on either side thereof.

The at least one electronic component 24 may form part of or constitute electronic control circuitry for the piezoelectric flexural transducer 1. The electronic circuitry may more especially comprise a voltage converting circuit for the input voltage applied to obtain the desired drive voltage. It is also an advantage to provide a current limiting circuit to prevent undesired changes in the piezoelectric characteristic owing to excess voltages. A charge and discharge circuit which renders possible the provision of a discharge necessary in the case of two wire operation for resetting the deflection or displacement, is also a advantage. It will be clear that this enumeration is purely by way of example and does not have an exclusive effect.

Figure 1:
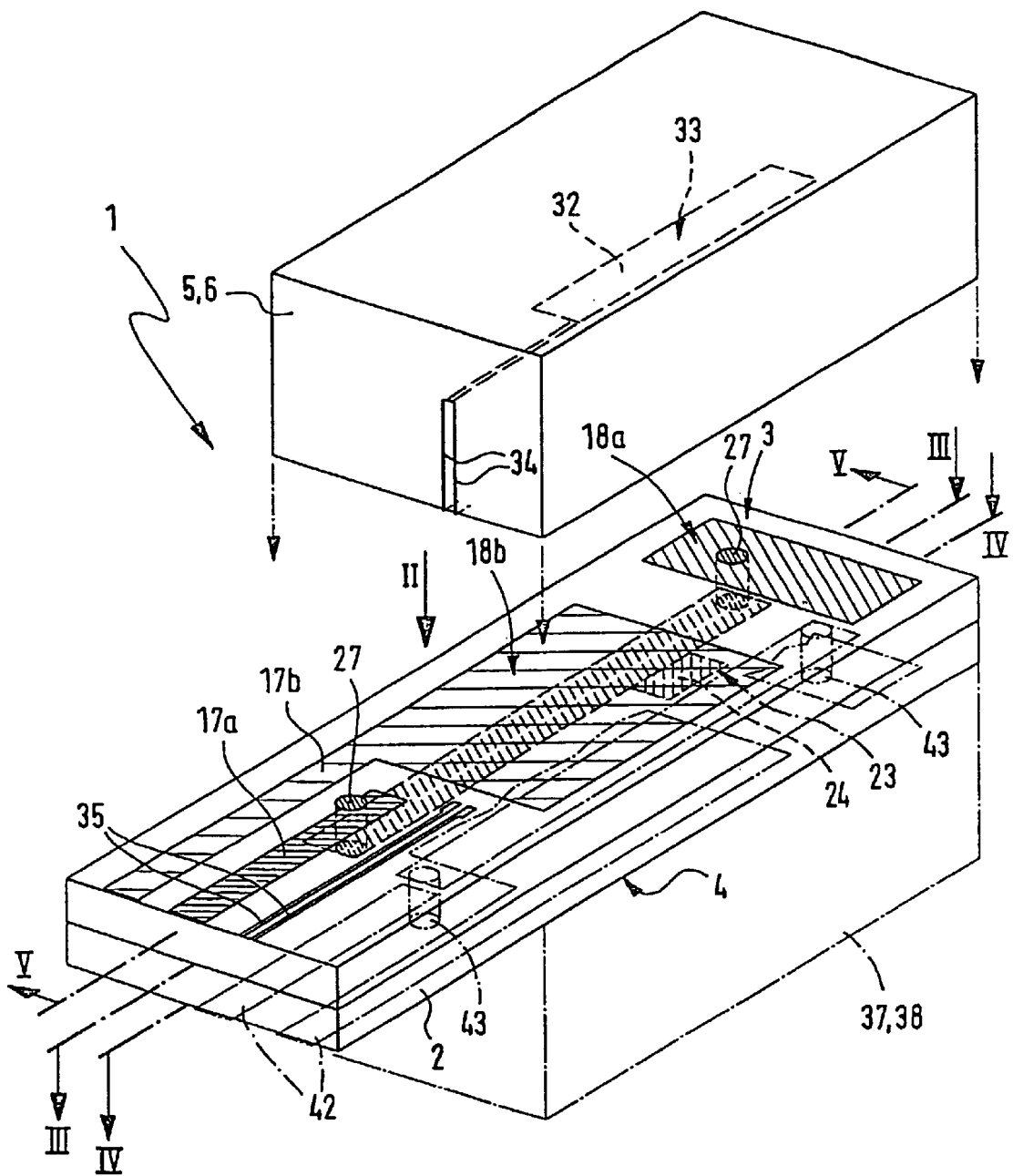
FIG. 1 shows a preferred embodiment of the piezoelectric flexural transducer of the invention in a greatly enlarged perspective elevation, which is partly exploded.
Figure 2:
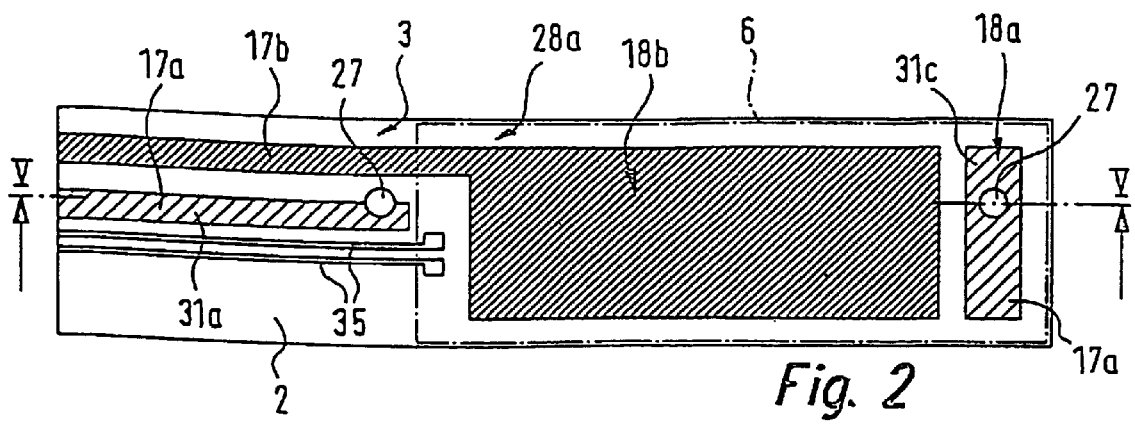
FIG. 2 is a plan view of the upwardly facing support face of the support body looking in the direction of the arrow II.
Figure 3:
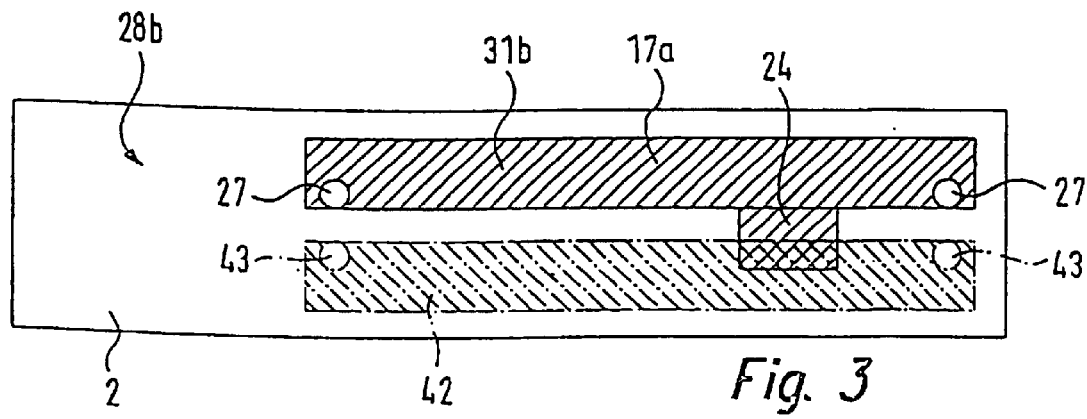
FIG. 3 is a longitudinal section taken through the support body of FIG. 1 on the section line III—III looking toward the upwardly facing face of the lower support body layer.
Figure 4:
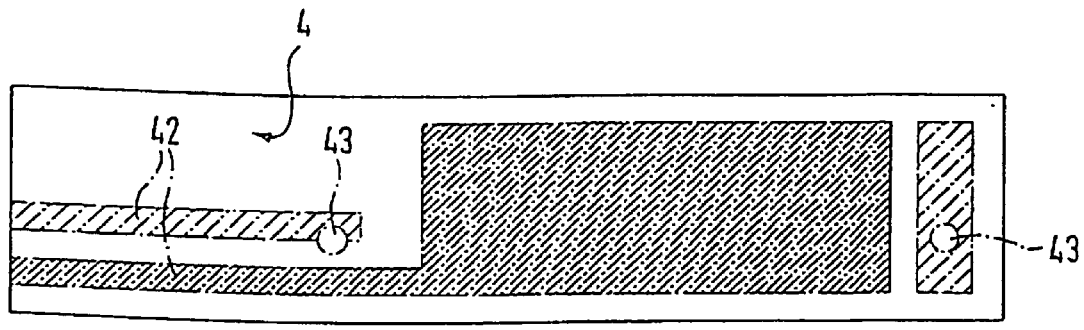
FIG. 4 is a longitudinal section taken through the support body as in FIG. 1 on the section line IV—IV, optionally present electrical conductors being indicated in chained lines on the downwardly facing support face.

The piezoelectric flexural transducer 1 of the working example is furthermore characterized in that it contains, in addition to at least one first electronic component, at least one sensor component 32, indicated in chained lines in FIGS. 1 and 5, of a sensor system 33 employed for the operation of the piezoelectric flexural transducer.

The at least one sensor component 32 is in the working example accommodated in the interior of the piezoelectric multi-layer body 6 between two neighboring piezoelectric material layers 7. It can be readily placed here in the course of manufacture of the piezoelectric multi-layer body 6. Electrical contacting means 34 necessary for its operation may for example be extended to an end face of the piezoelectric multi-layer body 6 and thence to the bottom side thereof so that they may make electrical contact with further electrical conductors 35 when the piezoelectric multi-layer body 6 is secured on the support body 2, such further electrical conductors 35 being provided on the first support face 3 in the vicinity of the section 16.

Owing to the placement of at least one sensor component 32 and preferably of the entire sensor system 33 in the interior of the piezoelectric flexural transducer 1 it is possible for the relevant factors to be detected at the relevant position. Moreover, installation, which would require additional space, on the outer face of the piezoelectric flexural transducer or on a housing for the piezoelectric flexural transducer 1 during later use thereof is unnecessary. This furthermore applies as well for the at least one integrated electronic component 24 or, respectively, electronic circuitry 23. Owing to accommodation in the interior of the piezoelectric flexural transducer 1 it is possible to dispense with further safety measures, since the components are shielded by the components, which surround them, of the piezoelectric flexural transducer 1 against external effects.

At least one sensor component 32 can also be integrated, in the manner described in connection with the electronic component 24, in the support body, just as at least one electronic component can be placed in the interior of the piezoelectric multi-layer body 6. A further advantageous position for the accommodation of an electronic and/or sensor component is between the support body 2 and the piezoelectric multi-layer body 6 secured thereon, FIG. 5 indicating in chained lines 24a and 24b a respective electronic and/or sensor component.

It will be clear that one and the same piezoelectric flexural transducer 1 may, in accordance with the particular application, be provided only with electronic components or only with sensor components or indeed simultaneously both with components of an electronic system or a sensor system as well. In such a case the position of accommodating the components may be freely selected.

A sensor system integrated in the piezoelectric flexural transducer 1 may as a sensor component more particularly comprise a deflection sensor, as for example a strain gage strip or some other pickup and coils, by means of which information is provided about the instantaneous deflection of the piezoelectric flexural transducer 1.

Figure 6:
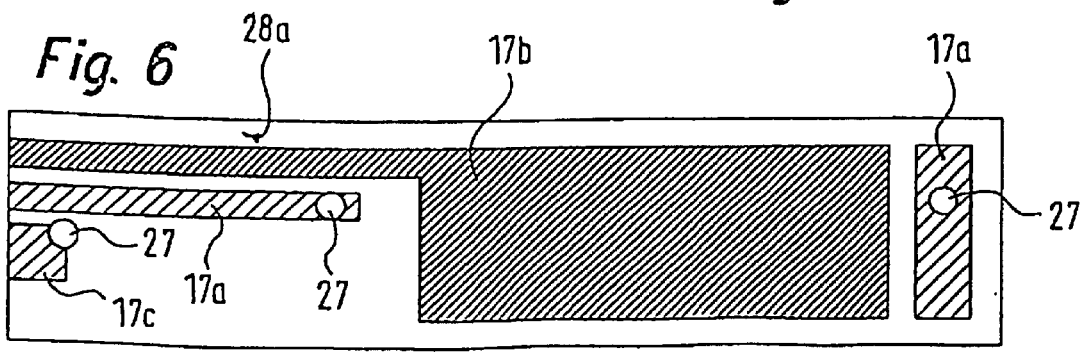
FIGS. 6 and 7 show longitudinal sections in accordance with FIGS. 2 and 3 taken through a support body of a further embodiment of the piezoelectric flexural transducer.
Figure 7:
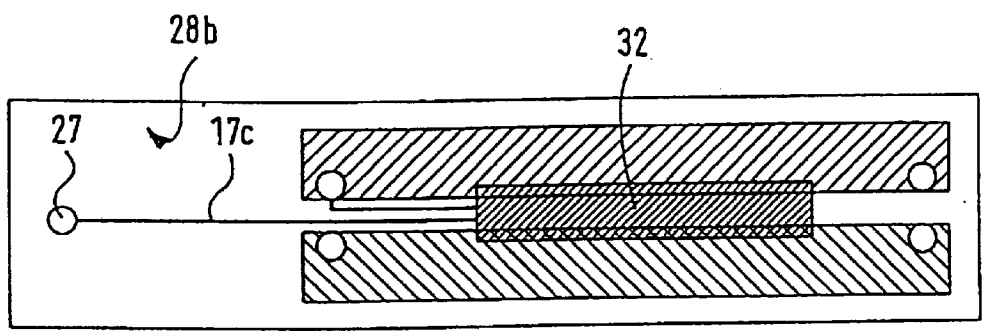

FIGS. 6 and 7 show a possibility as regards integration of a sensor component 32, in the form of a strain gage strip, in the support body 2. In this case it is clear that further third electrical conductors 17c may be provided, in addition to the above mentioned first and second conductors 17a and 17b, such third conductors serving for making electrical contact with the sensor components 32 and extending in the first and second component carrying planes 28a and 28b and being able to be linked by means of metal lined holes or metal filled holes 27a.

Further valuable sensor components are force sensors, acceleration sensors and temperature sensors, which may serve for optimally monitored actuation of the piezoelectric flexural transducer.

In order substantially not to impair the layer design of the piezoelectric multi-layer body 6 and/or of the support body 2—the planes of the support body layers extend in parallelism to those of the piezoelectric material layers—for the integrated electronic and/or sensor components 24 and 32 recourse is had to extremely thin structures, which hardly project. Such structures may be produced in so-called thin film technology or, respectively, as surface mounted device (SMD) components or as naked chips, that is to say non-encapsulated semiconductor chips. Since the layer area available for the accommodation of the components is extremely large, the circuit layout of the components may be made longer or wider in order to reduce the overall height.

Figure 8:
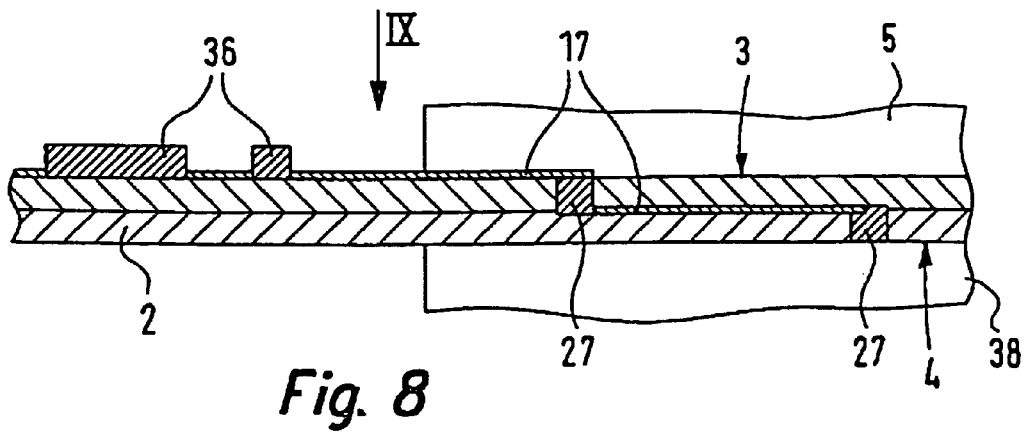
FIG. 8 shows a part of a further embodiment of the piezoelectric flexural transducer in a longitudinal section taken on the section line VIII—VIII of FIG. 9.
Figure 9:
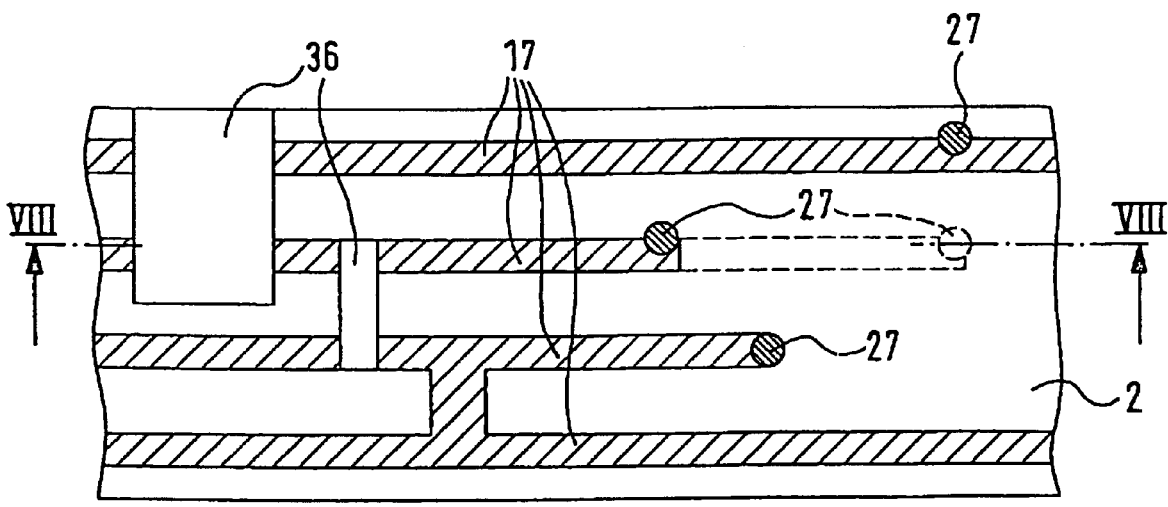
FIG. 9 is a plan view of the support face, directed upwardly; of the support body in accordance with FIG. 8 without showing the piezoelectric body thereon.

FIGS. 8 and 9 show alternative designs of a support body 2, it being apparent that additional electronic and/or sensor components 36 may be present, which are located in an outer face section, not occupied by a piezoelectric body, of the support body 2. They may more particularly be arranged on the free face section, extending on the connection section 16, of a support face 3.

FIGS. 8 and 9 furthermore indicate that electrical conductors 17 and metal lined holes or metal filled holes 27 may if required be arranged with practically any suitable distribution on the support body 2.

In the case of the metal lined holes or metal filled holes it is a question of electrically conductive materials, which are arranged in the support body 2 in openings or recesses extending athwart its plane of extent completely or partially through it. As materials it is for instance possible to use a conductive adhesive.

The piezoelectric flexural transducer 1 so far described may be termed a unimorphous flexural transducer. Owing to its asymmetrical structure in the case of such a unimorphous seal however relatively high thermal inherent bending does occur, which might impair the operation characteristics. Owing to the integrated sensor system piezoelectric relaxation and drift effects may however be systematically compensated so that with the integration in accordance with the invention the operational characteristics of a unimorphous flexural transducer may be relatively simply optimized. Furthermore, owing to the materials integrated in the support body the operating point of the flexural transducer may be systematically influenced.

A further possibility for an economic reduction in the inherent thermal bending or deflection is designing the piezoelectric flexural transducer in trimorphous technology and providing a body, termed an adaptive body 37 at the same level as the piezoelectric multi-layer body 6, such body consisting of a material, which essentially possesses the same coefficients of thermal expansion as the piezoelectric multi-layer body 6. Here it is useful to provide a second piezoelectric body 38 as an adaptive body 37, which body 38 has an essentially more economic monolithic structure as compared with a multi-layer structure. In this respect the piezoelectric material is preferably provided with the polarization normally necessary for an active operation in order to in fact have the same thermal characteristics as the piezoelectric multi-layer body 6. However, the second piezoelectric body 38 is not activated, it serving merely for adaptation or, respectively, in order to have a symmetrical structure.

All the same it would naturally be possible to provide a trimorphous flexural transducer on the basis of the invention, which has a two piezoelectric bodies 5 and 38 both able to be activated in order to deflect the piezoelectric flexural transducer 1 actively not only to one side but to both sides. In this case it is to be recommended to design the second piezoelectric body 38 in the form of a piezoelectric multi-layer body. The support body 2 can then, as indicated in chained lines in FIGS. 1 and 4, be provided with further electrical conductors 42 and metal lined holes or metal filled holes 43—similar to the above mentioned first and second electrical conductors 17a and 17b as described in detail and metal lined hole 27—which render possible driving a piezoelectric body 38 placed on the second support face 4. If the electronic and/or sensor components are placed in a piezoelectric multi-layer body 6 or in the transition between a piezoelectric body and the support body 2 the piezoelectric flexural transducer 1 may readily be provided with a single layer support body 2.

The piezoelectric flexural transducer may with advantage be employed as a setting member in a valve serving for the control of fluid flows. FIG. 5 indicates in chained lines a section of the housing 44 of a pneumatic valve, that has a fluid duct opening 45, which is closed or opened as desired by the activation or deactivation of the piezoelectric flexural transducer 1 by it.

What is claimed is:

1. A piezoelectric flexural transducer possessing an elongated support body, which on at least one longitudinal side is provided with a piezoelectric multi-layer body having a plurality of layers of piezoelectric material and intermediately placed electrodes, characterized in that in the interior of the support body and/or between the support body and the piezoelectric multi-layer body and/or between adjacent piezoelectric material layers of the piezoelectric multi-layer body at least one component of an electronic and/or sensor system, which is utilized for the operation of the piezoelectric flexural transducer, is accommodated.

2. The piezoelectric flexural transducer as set forth in claim 1, characterized in that at least one electronic component forms part of a voltage converting circuit or of a current limiting circuit or of a charging/discharging circuit or constitute such a circuit.

3. The piezoelectric flexural transducer as set forth in claim 1, characterized in that at least one electronic component constitutes part of control electronic circuitry for the piezoelectric flexural transducer or constitutes such circuitry.

4. The piezoelectric flexural transducer as set forth in claim 1, characterized in that at least one sensor component is constituted by a deflection sensor for detecting deflection of the flexural transducer and more especially by a strain gage strip or by inductive pickups and/or coils.

5. The piezoelectric flexural transducer as set forth in claim 1, characterized in that at least sensor component is constituted by force sensor, an acceleration sensor o and/or a temperature sensor.

6. The piezoelectric flexural transducer as set forth in claim 1, characterized in that at least one electronic and/or sensor component is one produced using thin film technology or, respectively, as a surface mounted device (SMD) component or as a naked chip.

7. The piezoelectric flexural transducer as set forth in claim 1, characterized in that the support body is designed in the form of a multi-layer body with at least two superposed support body layers.

8. The piezoelectric flexural transducer as set forth in claim 7, characterized in that the planes of the support body layers and of the piezoelectric material layers extend in parallelism to each other.

9. The piezoelectric flexural transducer as set forth in claim 7, characterized in that the at least one electronic and/or sensor component, which is arranged in the interior of the support body, is placed between two neighboring support body layers.

10. The piezoelectric flexural transducer as set forth in claim 1, characterized in that the support body is provided with electrical conductors arranged in different component carrying planes, such conductors being connected together electrically by means of one or more metal lined holes or metal filled holes running perpendicularly to the component carrying planes.

11. The piezoelectric flexural transducer as set forth in claim 10, characterized in that at least one metal lined hole is present, which extends through only one support body layer in order to contact electrical conductors on either side thereof.

12. The piezoelectric flexural transducer as set forth in claim 1, characterized in that the piezoelectric sensor only partly occupies the support face of the support body facing it, a free section of the support face carrying at least one further electronic component.

13. The piezoelectric flexural transducer as set forth in claim 1, characterized in that the thickness of the individual piezoelectric material layers is at the most 25 $\mu$m, preferably lies in a range between 14 $\mu$m and 20 $\mu$m and more particularly is equal to 17 $\mu$m.

14. The piezoelectric flexural transducer as set forth in claim 1, characterized in that the thickness of the piezoelectric material layers is so set that the drive voltage necessary for the operation of the piezoelectric flexural transducer is 60 volts at the most.

15. The piezoelectric flexural transducer as set forth in claim 1, characterized in that the support body bears a monolithic piezoelectric body on the longitudinal side opposite to the piezoelectric multi-layer body.

16. The piezoelectric flexural transducer as set forth in claim 1, characterized in that on the longitudinal side opposite to the piezoelectric multi-layer body the support body is provided with an adaptive body of a material having essentially the same coefficients of thermal expansion as the piezoelectric material of the piezoelectric multi-layer body.

17. The piezoelectric flexural transducer as set forth in claim 1, characterized in that the support body mounts a further piezoelectric multi-layer body on the longitudinal side opposite to the piezoelectric multi-layer body.

18. The use of the piezoelectric flexural transducer as set forth in claim 1 as a setting member of a valve and more especially a valve in the pneumatic sector.

* * * * *